United States Patent [19]

Newman

[11] 4,117,348

[45] Sep. 26, 1978

[54] MULTI-PHASE CLOCK MONITOR CIRCUIT

[75] Inventor: Francis L. Newman, El Toro, Calif.

[73] Assignee: Rockwell International Corporation, El Segundo, Calif.

[21] Appl. No.: 814,246

[22] Filed: Jul. 11, 1977

[51] Int. Cl.$^2$ .................. H03K 5/18; H03K 19/00
[52] U.S. Cl. ................................ 307/232; 307/246; 307/269; 328/109; 328/120
[58] Field of Search ............... 307/200 A, 200 B, 231, 307/232, 234, 269, 246; 328/108, 109, 110, 120

[56] References Cited

U.S. PATENT DOCUMENTS 3,577,087  5/1971  Martin et al. ..................... 307/232 X

OTHER PUBLICATIONS

D. J. Zimmerman, "Missing-Clock Detector", IBM Technical Disclosure Bulletin, vol. 19, No. 5, Oct. 1976, pp. 1905–1906.

Primary Examiner—John Zazworsky
Attorney, Agent, or Firm—H. Fredrick Hamann; G. Donald Weber, Jr.; Morland C. Fischer

[57] ABSTRACT

A test circuit to continuously monitor both narrow width ($\phi_1$ and $\phi_3$) and wide width ($\phi_{1+2}$ and $\phi_{3+4}$) multi-phase clocks for proper toggling or switching. If any one of the clocks fails to toggle (i.e. remains at a constant output voltage level) or if either of the $\phi_1$ and $\phi_3$ or $\phi_{1+2}$ and $\phi_{3+4}$ clocks are on at the same time, the circuit provides a corresponding output signal, which signal is indicative of a clock failure.

18 Claims, 2 Drawing Figures

MULTI-PHASE CLOCK MONITOR CIRCUIT

BACKGROUND OF THE INVENTION

1. Field of the Invention

This invention relates to a test circuit to continuously monitor the reliability of the clocks which comprise a two or four phase clock system.

2. Prior Art

Conventional multi-phase clock monitor circuits are typically external test circuits. That is, the prior art clock monitor circuits are fabricated off the microelectronic chip containing the clocks to be tested. This has the undesirably effects of increasing space consumption, costs, and power usage, while reducing overall efficiency of the clock monitor.

SUMMARY OF THE INVENTION

Briefly, and in general terms, an on-chip test circuit is disclosed to monitor both narrow and wide width clocks of a multiphase clock system for proper toggling or switching. The circuit comprises first and second test sections, of substantially identical construction, to monitor the narrow width clocks and wide width clocks, respectively. The test circuit also includes a NOR gate to provide output signals indicative of the reliability of the clocks to properly toggle. A pair of signal inverters is connected between each test section and input terminal means of the NOR gate. The circuit is comprised of a plurality of transistor devices which are particularly sized relative to one another to provide proper circuit operation.

When a clock is toggling properly, a storage capacitor of the first or second test section is charged to, thereby, cause the output terminal of the NOR gate to be selectively clamped to a first logic level indicative of clock reliability. However, should the clock subsequently fail, the storage capacitor of the first or second test section is discharged, so that the output terminal of the NOR gate is selectively driven to a second logic level indicative of a clock failure.

DESCRIPTION OF THE PREFERRED EMBODIMENT

Figure 1:
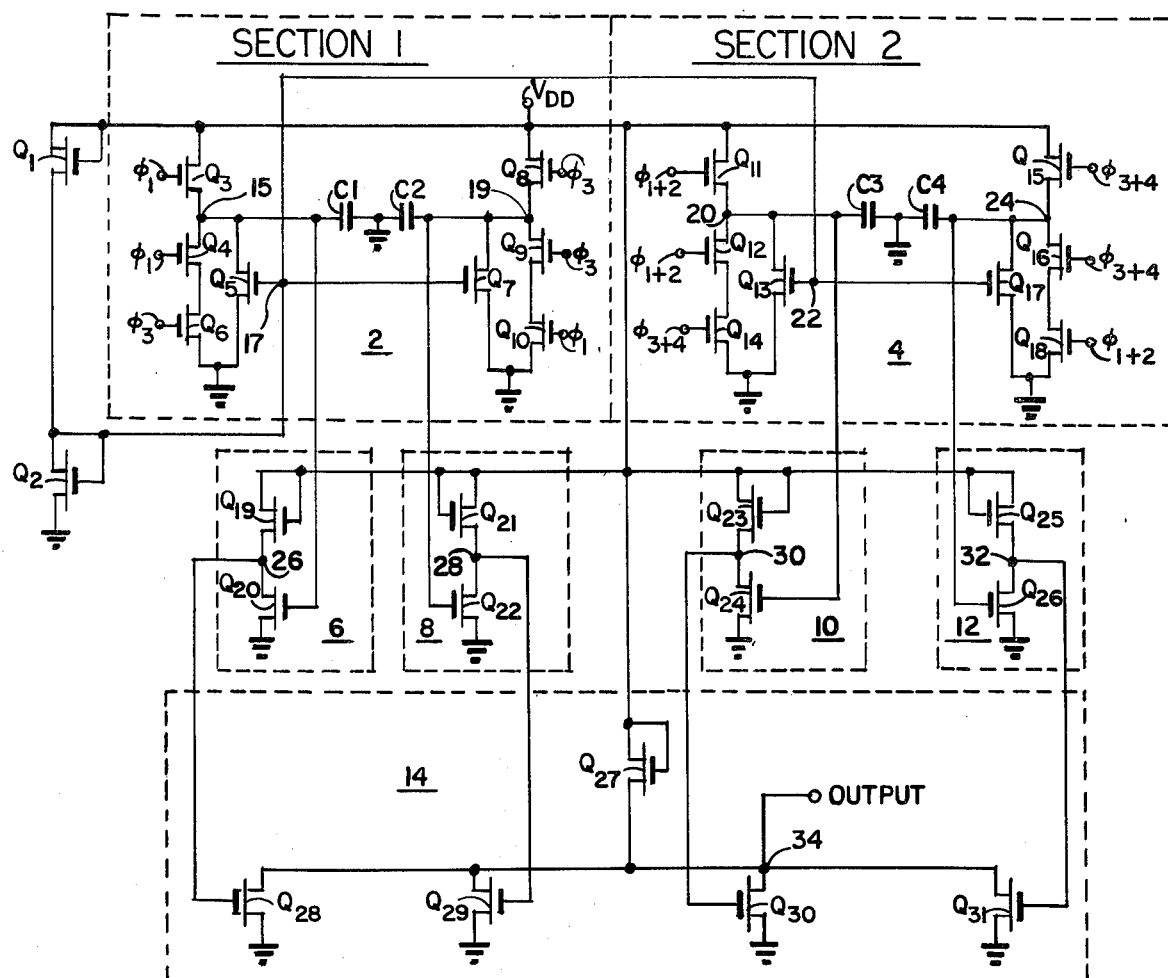
FIG. 1 is a schematic diagram showing a preferred circuit for implementing the clock monitor of the present invention.

FIG. 1 of the drawings is a schematic diagram of a preferred circuit to implement the multi-phase clock monitor of the present invention. The clock monitor circuit comprises first and second clock signal test sections 2 and 4, four signal inverters 6, 8, 10, 12, and a NOR gate 14, which gate provides an output signal indicative of the validity or failure of each of the multi-phase clocks which are tested.

Figure 2:
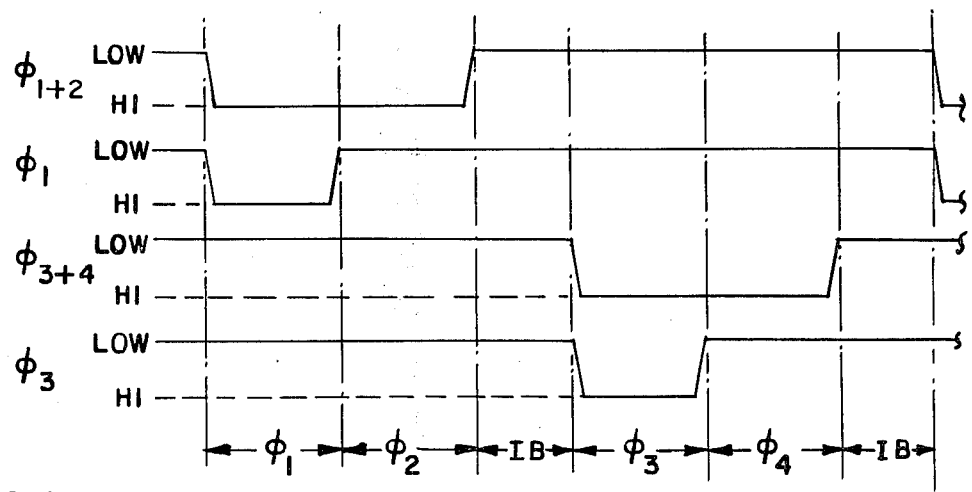
FIG. 2 illustrates examples of the narrow and wide waveforms generated by the multi-phase clocks to be tested by the clock monitor circuit of FIG. 1.

Typically, and as best illustrated in FIG. 2, a multi-phase clock system includes both single width clock signals (e.g. $\phi_1$ and $\phi_3$) and double width clock signals (e.g. $\phi_{1+2}$ and $\phi_{3+4}$). The first clock signal test section 2 monitors the single width multi-phase clock signals $\phi_1$ and $\phi_3$, while the second clock signal test section 4 monitors the double width multi-phase clock signals $\phi_{1+2}$ and $\phi_{3+4}$. Since the construction of each of the first and second clock signal test sections 2 and 4 is substantially identical, only the first signal clock section 2 of the present clock monitor will be described in particular detail.

The first clock signal test section 2 includes a plurality of multi-terminal semiconductor transistor devices, such as p-channel field effect transistors (FETs) $Q_3$–$Q_{10}$. A first half of the test section 2 includes a precharge field effect transistor $Q_3$ having a conduction path connected between a source of relatively negative reference potential, designated $V_{DD}$, and an electrical junction 15. The respective conduction paths of field effect transistors $Q_4$ and $Q_6$ are connected together in electrical series between electrical junction 15 and a source of relatively positive reference potential, such as ground. The control or gate electrodes of FETs $Q_3$ and $Q_4$ are connected to a multi-phase clock signal generator (not shown) to receive the first single width clock signal $\phi_1$. The gate electrode of FET $Q_6$ is connected to the multi-phase clock signal generator to receive the second single width clock signal $\phi_3$. The conduction path of another field effect transistor $Q_5$ is connected between electrical junction 15 and the source of reference potential, such as ground, whereby the conduction path of FET $Q_5$ is connected in electrical parallel with the series connected conduction paths of FETs $Q_4$ and $Q_6$. The gate electrode of FET $Q_5$ is connected to an electrical junction 17. In a preferred embodiment, FET $Q_5$ is fabricated with a very high on-resistance (and a very small channel width) with respect to that of precharge FET $Q_3$ and FETs $Q_4$ and $Q_6$. Moreover, the on-resistance of FETs $Q_4$ and $Q_6$ are made very low with respect to that of precharge FET $Q_3$. One plate of a first charge storage capacitor $C_1$ is connected to the electrical junction 15. The second plate of storage capacitor $C_1$ is connected to ground.

A second half of the first clock signal test section 2 includes a precharge field effect transistor $Q_8$ having a conduction path connected between the reference potential source $V_{DD}$ and an electrical junction 19. The respective conduction paths of field effect transistors $Q_9$ and $Q_{10}$ are connected together in electrical series between electrical junction 19 and ground. The gate electrodes of FETs $Q_8$ and $Q_9$ are connected to the multi-phase clock signal generator to receive the single width clock signal $\phi_3$. The gate electrode of FET $Q_{10}$ is connected to the multi-phase clock signal generator to receive the single width clock signal $\phi_1$. The conduction path of another field effect transistor $Q_7$ is connected between electrical junction 19 and ground, whereby the conduction path of FET $Q_7$ is connected in electrical parallel with the series connected conduction paths of FETs $Q_9$ and $Q_{10}$. The gate electrode of FET $Q_7$ is connected to the electrical junction 17 with the gate electrode of FET $Q_5$. In a preferred embodiment, FET $Q_7$ is fabricated with a very high on-resistance with respect to that of precharge FET $Q_8$ and FETs $Q_9$ and $Q_{10}$. Moreover, the on-resistance of FETs $Q_9$ and $Q_{10}$ are made very low with respect to that of precharge FET $Q_8$. One plate of a second charge storage capacitor $C_2$ is connected to electrical junction 19. The second plate of storage capacitor $C_2$ is connected to ground with the second plate of charge storage capacitor $C_1$.

Since the construction of the second clock signal test section 4 of the present clock monitor is substantially identical to that of the first test section 2 of the clock monitor, only a brief description of the second test section 4 is provided. Field effect transistors $Q_{11}$–$Q_{18}$, which form the second clock signal test section 4, are substituted for the respective field effect transistors $Q_3$–$Q_{10}$ of the first clock signal test section 2, and third and fourth storage capacitors $C_3$ and $C_4$ are substituted for storage capacitors $C_1$ and $C_2$. Moreover, the gate electrodes of FETs $Q_{11}$ and $Q_{12}$ (similar to FETs $Q_3$ and $Q_4$ are connected to the multi-phase clock signal generator to receive the first double width clock signal $\phi_{1+2}$. The gate electrode of FET $Q_{14}$ (similar to FET $Q_6$) is connected to the multi-phase clock signal generator to receive the second double width clock signal $\phi_{3+4}$. The gate electrodes of FETs $Q_{15}$ and $Q_{16}$ (similar to FETs $Q_8$ and $Q_9$) are connected to the multi-phase clock signal generator to receive the second double width clock signal $\phi_{3+4}$. The gate electrode of FET $Q_{18}$ (similar to FET $Q_{10}$) is connected to the multi-phase clock signal generator to receive the first double width clock signal $\phi_{1+2}$. The gate electrodes of FETs $Q_{13}$ and $Q_{17}$ (similar to FETs $Q_5$ and $Q_7$) are connected together at an electrical junction 22 (similar to electrical junction 17). Electrical junctions 17 and 22 are connected together. Storage capacitor $C_3$ is connected between an electrical junction 20 (similar to electrical junction 15) and ground. Storage capacitor $C_4$ is connected between an electrical junction 24 (similar to electrical junction 19) and ground.

The respective conduction paths of a pair of field effect transistors $Q_1$ and $Q_2$ are connected together in electrical series between the $V_{DD}$ and ground sources of reference potential. The gate electrode of FET $Q_1$ is also connected to the $V_{DD}$ source of reference potential. The gate electrode and one conduction path electrode of FET $Q_2$ are connected together and to the electrical junctions 17 and 22. In a preferred embodiment, FET $Q_2$ is fabricated with a very low on-resistance (and a very large channel width) with respect to that of FET $Q_1$.

A first pair of signal inverters 6 and 8 is connected between the first clock signal test section 2 and the NOR gate 14. A second pair of signal inverters 10 and 12 is connected between the second clock signal test section 4 and the NOR gate 14. Since the construction of inverters 6 and 8 is substantially identical to that of inverters 10 and 12, only inverters 6 and 8 will be described in particular detail. Inverter 6 includes a pair of field effect transistors $Q_{19}$ and $Q_{20}$ having their respective conduction paths connected together in electrical series between $V_{DD}$ and ground. The gate electrode of FET $Q_{19}$ is connected to the $V_{DD}$ source of reference potential, and the gate electrode of FET $Q_{20}$ is connected to the electrical junction 15 of the first clock signal test section 2, which electrical junction 15 comprises an input terminal of inverter 6. Inverter 8 includes a pair of field effect transistors FETs $Q_{21}$ and $Q_{22}$ having their respective conduction paths connected together in electrical series between $V_{DD}$ and ground. The gate electrode of FET $Q_{21}$ is connected to the $V_{DD}$ source of reference potential, and the gate electrode of FET $Q_{22}$ is connected to the electrical junction 19 of the first clock signal test section 2, which electrical junction 19 comprises an input terminal of inverter 8. In a preferred embodiment, FETs $Q_{20}$ and $Q_{22}$ are fabricated with a very low on-resistance (and a very large channel width) with respect to that of FETs $Q_{19}$ and $Q_{21}$.

Since the construction of signal inverters 10 and 12 are substantially identical to inverters 6 and 8, only a brief description of inverters 10 and 12 is provided. Field effect transistors $Q_{23}$ and $Q_{24}$ of inverter 10 are similar to the respective field effect transistors $Q_{19}$ and $Q_{20}$ of inverter 6. However, the gate electrode of FET $Q_{24}$ is connected to the electrical junction 20 of the second clock signal test section 4, which electrical junction 20 comprises an input terminal of inverter 10. Field effect transistors $Q_{25}$ and $Q_{26}$ of inverter 12 are similar to field effect transistors $Q_{21}$ and $Q_{22}$ of inverter 8. However, the gate electrode of FET $Q_{26}$ is connected to the electrical junction 24 of the second clock signal test section 4, which electrical junction 24 comprises an input terminal of inverter 12.

The NOR gate 14 of the present clock monitor circuit is comprised of five field effect transistors $Q_{27}$–$Q_{31}$. The gate electrode and one conduction path electrode of FET $Q_{27}$ are connected to the $V_{DD}$ source of reference potential. The second conduction path electrode of FET $Q_{27}$ is connected to an electrical junction 34, which junction forms an output terminal of both the NOR gate 14 and present clock monitor circuit. The conduction path of FET $Q_{28}$ is connected between output terminal 34 and ground. The gate electrode of FET $Q_{28}$ is connected to an electrical junction 26 which is formed between the conduction paths of FETs $Q_{19}$ and $Q_{20}$ of inverter 6. Electrical junction 26 comprises a first input terminal of NOR gate 14. The conduction path of FET $Q_{29}$ is connected between the output terminal 34 and ground. The gate electrode of FET $Q_{29}$ is connected to an electrical junction 28 which is formed between the respective conduction paths of FETs $Q_{21}$ and $Q_{22}$ of inverter 8. Electrical junction 28 comprises a second input terminal of NOR gate 14. The conduction path of FET $Q_{30}$ is connected between output terminal 34 and ground. The gate electrode of FET $Q_{30}$ is connected to an electrical junction 30 which is formed between the respective conduction paths of FETs $Q_{23}$ and $Q_{24}$ of inverter 10. Electrical junction 30 comprises a third input terminal of NOR gate 14. The conduction path of FET $Q_{31}$ is connected between output terminal 34 and ground. The gate electrode of FET $Q_{31}$ is connected to an electrical junction 32 which is formed between the respective conduction paths of FETs $Q_{25}$ and $Q_{26}$ of inverter 12. Electrical junction 32 comprises a fourth input terminal of NOR gate 14. In a preferred embodiment, FET $Q_{27}$ is fabricated with a very high on-resistance (and a very small channel width) relative to that of FETs $Q_{28}$–$Q_{31}$.

FIG. 2 shows the waveforms of the multi-phase clock signals to be tested by the clock monitor circuit of FIG. 1. Each of the single width clock signals, $\phi_1$ and $\phi_3$, and each of the double width clock signals, $\phi_{1+2}$ and $\phi_{3+4}$, toggle between a relatively HI (true) logic level, corresponding to a negative voltage signal, such as, for example, $V_{DD}$, and a relatively LOW (false) logic level, corresponding to a relatively positive voltage signal, such as ground.

As will be explained in greater detail hereinafter, when each of the multi-phase clocks is toggling properly, each of the electrical junctions 15, 19, 20 and 24 of the first and second clock signal test sections 2 and 4 receives a nearly constant negative voltage charge. Moreover, electrical junction 34 of NOR gate 14 (i.e. the output terminal of the clock monitor) receives a relatively negative voltage signal via the conduction path of FET $Q_{27}$, which signal is indicative of clock reliability. However, if any one or more of the multi-phase clocks is not properly toggling, some of the electrical junctions 15, 19, 20 and 24 are discharged. Output terminal 34 otherwise receives a relatively positive voltage signal (e.g. ground) via the conduction path of one of the NOR gate FETs $Q_{28}$, $Q_{29}$, $Q_{30}$ and $Q_{31}$, which signal is indicative of a clock failure. Since the circuit operation of the first and second clock signal test sections 2 and 4 is substantially identical, only the operation of the first section will be explained in detail.

The reliability with which the narrow width $\phi_1$ clock signal toggles to a relatively HI (logic "1") level is tested by means of the first half of the first clock signal test section 2, comprising FETs $Q_3$–$Q_6$ and storage capacitor $C_1$. Referring concurrently to FIGS. 1 and 2, during an interval of time designated $\phi_1$, when a properly toggling $\phi_1$ clock signal has a relatively HI logic level and a properly toggling $\phi_3$ clock signal has to a relatively LOW (logic "0") level, FETs $Q_3$ and $Q_4$ are rendered conducting, inasmuch as the relatively HI level clock signal $\phi_1$ is applied to the gate electrodes thereof. Moreover, FET $Q_6$ is rendered non-conducting, inasmuch as the relatively LOW level clock signal $\phi_3$ is applied to the gate electrode thereof. As previously disclosed, FET $Q_5$ is fabricated with a relatively high on-resistance (compared to FETs $Q_4$ and $Q_6$), and FET $Q_2$ is fabricatd with a relatively low on-resistance (compared to FET $Q_1$). Therefore, FET $Q_5$ is nearly rendered non-conducting inasmuch as the gate electrode thereof, which is connected to electrical junction 17, receives a voltage via the conduction path of FET $Q_2$, which voltage bearly exceeds the threshold requirement of FET $Q_5$. Hence, electrical junction 15 and storage capacitor $C_1$ are charged to a relatively negative voltage via the conduction path of precharge FET $Q_3$. As long as the $\phi_1$ clock signal continues to repeatedly toggle to a relatively HI logic level during each succeeding clock cycle so that electrical junction 15 and storage capacitor $C_1$ are precharged via FET $Q_3$, storage capacitor $C_1$ will not be completely discharged via the conduction path of FET $Q_5$. As a result, FET $Q_{20}$, which forms the first test section signal inverter 6, is rendered conducting, inasmuch as the gate electrode thereof is also charged by the relatively negative voltage at electrical junction 15 (i.e. the input terminal of inverter 6). The electrical junction 26 of inverter 6 (i.e. the first input terminal of NOR gate 14) is clamped to ground via the conduction path of FET $Q_{20}$. Therefore, when the $\phi_1$ clock signal properly toggles to a relatively HI logic level, the gate electrode of FET $Q_{28}$ of the NOR gate 14 is also clamped to ground at NOR gate input terminal 26. FET $Q_{28}$ is accordingly rendered non-conducting. The clock monitor output terminal 34 is driven to a negative voltage level signal via the conduction path of FET $Q_{27}$ which, thereby, indicates the validity of the $\phi_1$ clock signal during the $\phi_1$ time interval.

However, should the $\phi_1$ clock signal fail to properly toggle to a relatively HI level during the $\phi_1$ time interval of succeeding clock cycles so that precharge FET $Q_3$ is rendered non-conducting, storage capacitor $C_1$ is eventually completely discharged and electrical junction 15 is clamped to ground via the conduction path of FET $Q_5$. FET $Q_{20}$ of the signal inverter 6 is rendered non-conducting, inasmuch as the gate electrode thereof is connected to electrical junction 15. FET $Q_{19}$ of inverter 6 is, thereupon, rendered conducting, inasmuch as the gate electrode thereof is connected to the $V_{DD}$ source of reference potential. Electrical junction 26 of inverter 6 (i.e. the first input terminal of NOR gate 14) receives a relatively negative voltage signal via the conduction path of FET $Q_{19}$. FET $Q_{28}$ of the NOR gate 14 is rendered conducting to drive electrical junction 34, inasmuch as the gate electrode of FET $Q_{28}$ is connected to the electrical junction 26. Therefore, during the $\phi_1$ time interval, when the $\phi_1$ clock signal fails to properly toggle to a relatively HI logic level, the clock monitor output terminal, formed by the electrical junction 34 of NOR gate 14, is clamped to ground via the conduction path of FET $Q_{28}$ to, thereby, provide an indication of the failure of the $\phi_1$ clock signal during the $\phi_1$ time interval.

The reliability with which the narrow width $\phi_1$ clock signal toggles to a relatively LOW (logic "0") level is tested by means of the second half of the first clock signal test section 2, comprising FETs $Q_7$–$Q_{10}$ and storage capacitor $C_2$. During an interval of time designated $\phi_3$, when a properly toggling $\phi_1$ clock signal has a relatively LOW level and a properly toggling $\phi_3$ clock signal has a relatively HI level, FETs $Q_8$ and $Q_9$ are rendered conducting, inasmuch as the relatively HI level clock signal $\phi_3$ is applied to the gate electrodes thereof. Moreover, FET $Q_{10}$ is rendered non-conducting, inasmuch as the relatively LOW level clock signal $\phi_1$ is applied to the gate electrode thereof. As previously disclosed, FET $Q_7$ is fabricated with a relatively high on-resistance. Therefore, FET $Q_7$ is nearly rendered non-conducting, inasmuch as the gate electrode thereof, which is connected to electrical junction 17, receives a voltage via the conduction path of FET $Q_2$, which voltage bearly exceeds the threshold requirement of FET $Q_7$. Hence, electrical junction 19 and storage capacitor $C_2$ are charged to a relatively negative voltage via the conduction path of precharge FET $Q_8$. As long as electrical junction 19 and the storage capacitor $C_2$ are precharged via FET $Q_8$, storage capacitor $C_2$ will not be completely discharged via the conduction path of FET $Q_7$. As a result, FET $Q_{22}$, which forms the first test section signal inverter 8, is rendered conducting, inasmuch as the gate electrode thereof is also charged by the relatively negative voltage at electrical junction 19 (i.e. the input terminal of inverter 8). The electrical junction 28 of inverter 8 (i.e. the second input terminal of NOR gate 14) is clamped to ground via the conduction path of FET $Q_{22}$. Therefore, when the $\phi_1$ clock signal properly toggles to a relatively LOW logic level, the gate electrode of FET $Q_{29}$ of the NOR gate 14 is also clamped to ground at the second NOR gate input terminal 28. FET $Q_{29}$ is accordingly rendered non-conducting. The clock monitor output terminal 34 is driven to a negative voltage level signal via the conduction path of FET $Q_{27}$ which, thereby, indicates the validity of the $\phi_1$ clock signal during the $\phi_3$ time interval.

However, should the $\phi_1$ clock signal fail to properly toggle to a relatively LOW level during the $\phi_3$ time interval (but, otherwise, remain at a relatively HI level), each of the FETs $Q_8$, $Q_9$ and $Q_{10}$ is rendered conducting, inasmuch as a relatively HI level signal is applied to the gate electrodes thereof. As previously disclosed, FETs $Q_9$ and $Q_{10}$ are fabricated with a relatively low on-resistance (and a very large channel width) with respect to that of precharge FET $Q_8$. Therefore, as a result of the relatively small combined on-resistances of FETs $Q_9$ and $Q_{10}$, storage capacitor $C_2$ is completely discharged and electrical junction 19 is clamped to ground during the $\phi_3$ time interval via the conduction paths of FETs $Q_9$ and $Q_{10}$. FET $Q_{22}$ of the signal inverter 8 is rendered non-conductive, inasmuch as the gate electrode thereof is connected to electrical junction 19 (i.e. the input terminal of inverter 8). FET $Q_{21}$ of inverter 8 is, thereupon, rendered conducting, inasmuch as the gate electrode thereof is connected to the $V_{DD}$ source of reference potential. Electrical junction 28 of inverter 8 (i.e. the second input terminal of NOR gate 14) receives a relatively negative voltage signal via the conduction path of FET $Q_{21}$. FET $Q_{29}$ of the NOR gate 14 is rendered conducting to drive electrical junction 34, inasmuch as the gate electrode of FET $Q_{29}$ is connected to the electrical junction 28. Therefore, during the $\phi_3$ time interval, when the $\phi_1$ clock signal fails to properly toggle to a relatively LOW logic level, the clock monitor output terminal, formed by the electrical junction 34 of NOR gate 14, is clamped to ground via the conduction path of FET $Q_{29}$ to, thereby, provide an indication of the failure of the $\phi_1$ clock signal during the $\phi_3$ time interval.

Since the first half of the first clock signal test section 2 (comprising FETs $Q_3$–$Q_6$ and storage capacitor $C_1$) is identical in construction to the second half thereof (comprising FETs $Q_7$–$Q_{10}$ and storage capacitor $C_2$) and since the $\phi_3$ clock signal is the same as the $\phi_1$ clock signal (except that the $\phi_3$ clock signal is delayed or shifted by 180°), the $\phi_3$ clock signal is tested in the identical manner by which the $\phi_1$ clock signal is tested. However, the second half of the first clock signal test section 2 tests the reliability of the $\phi_3$ clock signal to toggle to a relatively HI logic level during the $\phi_3$ time interval, while the first half of the first clock signal test section 2 tests the reliability with which the $\phi_3$ clock signal toggles to a relatively LOW logic level during the $\phi_1$ time interval.

The field effect transistors (FETs $Q_{19}$–$Q_{22}$ which comprise signal inverters 6 and 8 are utilized to determine if each of the $\phi_1$ and $\phi_3$ clocks reliably toggles or otherwise, fails, and, as a result, produces a constant output voltage level in the range of voltages between $V_{DD}$ and ground. In a preferred embodiment, FETs $Q_{19}$ and $Q_{20}$ are selected with particular threshold voltages, so as to assure that electrical junction 15 is clamped at or near ground in the event that a multi-phase clock fails to properly toggle. The threshold voltage of FETs $Q_{19}$ and $Q_{20}$ (as well as that of FETs $Q_3$–$Q_{10}$) is typically $-1.0$ volts d.c. (when $V_{DD}$ is selected to be $-5.0$ volts d.c.). Moreover, FET $Q_{20}$ is particularly sized so that its gate electrode must receive a voltage of, for example, at least 1.5 volts more negative than the threshold voltage thereof to be rendered conducting. By way of a first example, it is assumed that the output voltage level of a failed $\phi_1$ clock remains constant at any voltage (e.g. $-2.0$ volts) in a range of voltages between ground and $-3.5$ volts d.c. Therefore, during the $\phi_1$ time interval, electrical junction 15 and storage capacitor $C_1$ are precharged to a voltage level of approximately $-1.0$ volts d.c. (one threshold level more positive than the constant $\phi_1$ clock signal applied to the gate electrode of precharge FET $Q_3$). Hence, FET $Q_{20}$ is rendered non-conducting, inasmuch as the gate electrode thereof, connected to electrical junction 15, receives insufficient voltage. FET $Q_{28}$ is rendered conducting, inasmuch as the gate electrode thereof is connected to the $V_{DD}$ source via the conduction path of FET $Q_{19}$ and inverter output terminal 26. Thus, during the $\phi_1$ time interval, the clock monitor output terminal, comprising electrical junction 34 of NOR gate 14, is clamped to ground via the conduction path of FET $Q_{28}$ to thereby provide an indication of the failure of the $\phi_1$ clock.

By way of a second example, it is assumed that the output voltage level of a failed $\phi_1$ clock remains constant at $-3.5$ volts d.c. Hence, during the $\phi_1$ time interval, electrical junction 15 and storage capacitor $C_1$ are precharged to a voltage level of approximately $-2.5$ volts d.c. (one threshold level more positive than the constant $\phi_1$ clock signal applied to the gate electrode of FET $Q_3$). Therefore, FET $Q_{20}$ is just rendered conducting, inasmuch as the gate electrode thereof is connected to electrical junction 15 to receive the minimum required threshold voltage. In a manner previously disclosed, the clock monitor output terminal, comprising electrical junction 34 of NOR gate 14, is driven to a negative voltage level signal via the conduction path of FET $Q_{27}$ which (incorrectly) indicates the reliability of the $\phi_1$ clock during the $\phi_1$ time interval. However, the second half of the first clock signal test section 2, comprising FETs $Q_7$–$Q_{10}$ and storage capacitor $C_2$, must also be considered.

If, during the $\phi_3$ time interval, the output signal level of a failed $\phi_1$ clock remains constant at any voltage in the range of voltages between $-2$ volts d.c. to $V_{DD}$ to, thereby, enable FET $Q_{10}$, electrical junction 19 is clamped to ground via the conduction paths of FETs $Q_9$ and $Q_{10}$, inasmuch as the on-resistances of FETs $Q_9$ and $Q_{10}$ is relatively low with respect to that of FET $Q_8$ and the gate electrode of FET $Q_9$ is supplied with a relatively HI level $\phi_3$ clock signal. Therefore, FET $Q_{22}$ is rendered non-conducting, inasmuch as the gate electrode thereof is connected to electrical junction 19. In a preferred embodiment, FETs $Q_{21}$ and $Q_{22}$ (of inverter 8) are selected with a particular threshold voltage (e.g. $-1.0$ volts d.c.) to assure that electrical junction 19 is clamped at or near ground in the event that a multi-phase clock fails to properly toggle. Moreover, FET $Q_{22}$ is particularly sized so that its gate electrode must receive a voltage of at least 1.5 volts more negative than the threshold voltage thereof to be rendered conducting. Sufficient voltage is applied to the gate electrode of FET $Q_{29}$ via the conduction path of FET $Q_{21}$. Hence, FET $Q_{29}$ is rendered conducting and the clock monitor output terminal, comprising electrical junction 34 of NOR gate 14, is clamped to ground via the conduction path of FET $Q_{29}$ to, thereby, provide an indication of the failure of the $\phi_1$ clock signal during the $\phi_3$ time interval.

Therefore, a combination of tests are provided by the first clock signal test section 2, which tests overlap each other (electrical junction 15 being responsive to any voltage in the range of voltages between ground to $-3.5$ volts d.c. and electrical junction 19 being responsive to any voltage in the range of voltage between $-2.0$ volts d.c. to $V_{DD}$). Thus, when the $\phi_1$ clock provides any constant output voltage level between ground and $V_{DD}$, at least one of the input terminals (e.g. 26 or 28) of NOR gate 14 receives a relatively HI logic level signal to, thereby, clamp the clock monitor output terminal, comprising electrical junction 34, to ground to provide an indication of the failure of the $\phi_1$ clock.

If the $\phi_3$ clock fails to properly toggle but, otherwise provides a constant output voltage level between ground and $V_{DD}$, the clock monitor output terminal comprising electrical junction 34 of NOR gate 14, is clamped to ground to provide an indication of the failure thereof during one of the $\phi_3$ or $\phi_1$ time intervals. The $\phi_3$ clock is tested for a constant output voltage level in the identical manner by which the $\phi_1$ clock is tested. However, when testing the $\phi_3$ clock for a constant output voltage level, electrical junction 19 of the second half of test section 2 is responsive to the range of volages between ground and −3.5 volts d.c., while electrical junction 15 of the first half of test section 2 is responsive to the range of voltages between −2.0 volts d.c. to $V_{DD}$.

The wide width multi-phase clocks $\phi_{1+2}$ and $\phi_{3+4}$ are tested for proper toggling by the second clock signal test section 4. More particularly, the $\phi_{1+2}$ clock is tested in the identical manner by which the $\phi_1$ clock is tested, while the $\phi_{3+4}$ clock is tested in the identical manner by which the $\phi_3$ clock is tested.

It will be apparent that while a preferred embodiment of the invention is shown and described, various modifications and changes may be made without departing from the true spirit and scope of the invention. For example, the waveforms of the narrow and wide width clocks illustrated in FIG. 2 represent a four-phase clock system. However, it is to be understood that the presently disclosed clock monitor circuit is also suitable for testing the clocks which comprise a two-phase clock system. In the event that such a two-phase clock system is employed, the second clock signal test 4 is eliminated. It is also to be understood that the $\phi_1$, $\phi_3$, $\phi_{1+2}$, $\phi_{3+4}$, and $V_{DD}$ signal levels, as well as the suggested threshold voltages of the field effect transistors which comprise the present clock monitor circuit, are selected for exemplary purposes only. Any other suitable signal levels or voltages may be substituted therefor.

Having thus set forth a preferred embodiment of the instant invention, what is claimed is:

1. A circuit to test the reliability of the clocks comprising a multi-phase clock system to repeatedly switch between first and second recurring clock signal levels, said circuit including:
    source means to provide a plurality of reference potentials, first charge storage capacitance means,
    means by which to precharge said first charge storage capacitance means during a first phase time interval,
    first and second multi-terminal semiconductor devices connected in electrical series to form a first conditional discharge path between said first charge storage capacitance means and said source means,
    the control terminal of said first multi-terminal device connected to a first of said multi-phase clocks to be tested,
    the control terminal of said second multi-terminal device connected to a second of said multi-phase clocks to be tested,
    a third multi-terminal semiconductor device connected between said first charge storage capacitance means and said source means to form a second conditional discharge path,
    said first charge storage capacitance means remaining charged during a second phase time interval when each of said first and second clocks to be tested switches between the first and second signal levels or said first charge storage capacitance means discharged via one of said first or second conditional discharge paths during the second phase time interval when one of said first and second clocks to be tested fails to switch between the first and second signal levels,
    output terminal means responsive to the charge of said first charge storage capacitance means, and
    means to selectively connect said output terminal means to said source means to receive a first of said reference potentials when said first charge storage capacitance means remains charged to thereby indicate clock reliability or to selectively connect said output terminal means to said source means to receive a second of said reference potentials when said first charge storage capacitance means is discharged to thereby indicate a clock failure.

2. The test circuit recited in claim 1, wherein said means to precharge said first charge storage capacitance means and each of said first, second, and third multi-terminal semiconductor devices includes a field effect transistor.

3. The test circuit recited in claim 2, wherein the on-resistance of said third field effect transistor is substantially higher than that of said first and second field effect transistors.

4. The test circuit recited in claim 2, wherein the on-resistance of said precharge means field effect transistor is substantially higher than that of said first and second field effect transistors.

5. The test circuit recited in claim 1, further including fourth and fifth multi-terminal semiconductor devices connected in electrical series,
    the control terminal and one conducting path terminal of said fourth multi-terminal device connected to said source means, and
    the control terminal and one conduction path terminal of said fifth multi-terminal device connected to the control terminal of said third multi-terminal device.

6. The test circuit recited in claim 5, wherein each of said fourth and fifth multi-terminal semiconductor devices includes a field effect transistor,
    the on-resistance of said fourth field effect transistor being substantially higher than that of said fifth field effect transistor.

7. The test circuit recited in claim 1, further including inverter means,
    an input terminal of said inverter means connected to said charge storage capacitance means, and
    an output terminal of said inverter means connected to said means to selectively connect said circuit output terminal means to said source means.

8. The test circuit recited in claim 7, wherein said means to selectively connect said circuit output terminal means to said source means includes at least fourth and fifth multi-terminal semiconductor devices, each of said devices connected between said source means and said circuit output terminal means,
    said fourth multi-terminal device having a control terminal connected to said source means so as to selectively connect said circuit output terminal means to said source means to receive the first of said reference potentials indicative of clock reliability when said first charge storage capacitance means remains charged, and
    said fifth multi-terminal device having a control terminal connected to the output terminal of said inverter means so as to selectively connect said circuit output terminal means to said source means to receive the second of said reference potentials indicative of a clock failure when said first charge storage capacitance means is discharged.

9. The test circuit recited in claim 1, further including second charge storage capacitance means,
    means by which to precharge said second charge storage capacitance means during said second phase time interval, fourth and fifth multi-terminal semiconductor devices connected in electrical series to form a first conditional discharge path between said second charge storage capacitance means and said source means, the control terminal of said fourth multi-terminal device connected to the second of said multi-phase clocks to be tested, the control terminal of said fifth multi-terminal device connected to the first of said multi-phase clocks to be tested, and a sixth multi-terminal semiconductor device connected between said second charge storage capacitance means and said source means to form a second conditional discharge path for said second capacitance means, the control terminals of said third and sixth multi-terminal devices connected together, said second charge storage capacitance means remaining charged during said first phase time interval when each of said first and second clocks to be tested switches between the first and second signal levels, or said second charge storage capacitance discharged via one of said first or second conditional discharge paths thereof during said first phase time interval when the second of said first and second clocks to be tested fails to switch between the first and second signal levels, and means to selectively connect said circuit output terminal means to said source means to receive the first of said reference potentials when said second charge storage capacitance means remains charged to thereby indicate clock reliability or to selectively connect said output terminal means to said source means to receive the second of said reference potentials when said second charge storage means is discharged to thereby indicate a clock failure.

10. Clock reliability monitoring means comprising:
reference source means, clock test section means having first and second halves, each of said halves including a charge storage capacitor, means to precharge said capacitor, at least one conditional discharge path connected between said capacitor and said source means, and first and second clocks connected to control the conductivity of said conditional discharge path, NOR gate means having output terminal means selectively connected to said source means to provide first or second reference signals indicative of the reliability and failure of either of the first or second clocks, and inverter means having an input terminal respectively connected to the capacitor of each half of said clock test section and responsive to the charge thereon and an output terminal connected to input terminal means of said NOR gate means.

11. The clock monitoring means recited in claim 10, including first and second transistor devices respectively connected in electrical series between the capacitor of each half of said clock test section and said source means to form said at least one conditional discharge path for each of said halves, the control electrode of each first transistor device connected to said first clock, and the control electrode of each second transistor device connected to said second clock.

12. The clock monitor means recited in claim 11, further including a third transistor device respectively connected between the capacitor of each half of said clock test section and said source means to form a second conditional discharge path for each of said halves, the control electrodes of each third transistor device connected together.

13. The clock monitoring means recited in claim 12, further including a fourth and fifth transistor device connected in electrical series, one conduction path electrode and the control electrode of said fourth transistor device connected together and to said source means, and one conduction path electrode and the control electrode of said fifth transistor device connected together with the control electrodes of the third transistor devices.

14. The test circuit recited in claim 2, wherein the on-resistance of said third field effect transistor is substantially higher than that of said precharge means field effect transistor.

15. A reliability test circuit for testing the ability of a plurality of multi-phase clocks to switch between first and second signal levels, said test circuit comprising:
first and second sources of supply voltage,
charge storage capacitance means,
precharge means connected between said capacitance means and said first source of supply voltage to charge said capacitance means to the first supply voltage during a first multiphase clock time interval,
conditional discharge path means connected between said capacitance means and said second source of supply voltage,
a plurality of said clocks to be tested connected to said conditional discharge path means to control the conductivity thereof, whereby said capacitance means remains charged at the first supply voltage during a second multi-phase clock time interval when each of said clocks to be tested switches between the first and second signal levels, or said capacitance means discharged to the second supply voltage via said discharge path means during the second multi-phase clock time interval when one of said plurality of clocks to be tested fails to switch between the first and second signal levels, and
output terminal means responsive to the charge of said capacitance means to thereby provide an indication of the switching reliability of said multi-phase clocks to be tested.

16. The test circuit recited in claim 15, wherein said conditional discharge path means comprises a plurality of series connected transistors,
each of said multi-phase clocks to be tested respectively connected to the control electrode of one of said transistors to thereby control the conductivity of said discharge path means depending upon the ability of said multi-phase clocks to switch between the first and second signal levels.

17. The test circuit recited in claim 15, wherein one of said plurality of multi-phase clocks to be tested is connected to said conditional discharge path means and to said precharge means to control the respective conductivities thereof and to enable said precharge means to charge said capacitance means during the first multiphase clock time interval.

18. The test circuit recited in claim 17, including a second conditional discharge path means connected between said capacitance means and said second source of supply voltage, said second additional discharge path means adapted to discharge said capacitance means to the second supply voltage in the event that the multi-phase clock which is connected to said precharge means fails to properly switch between the first and second signal levels.

* * * * *